United States Patent [19]

Takeda et al.

[11] 4,347,306

[45] Aug. 31, 1982

[54] METHOD OF MANUFACTURING ELECTRONIC DEVICE HAVING MULTILAYER WIRING STRUCTURE

[75] Inventors: Shiro Takeda, Sagamihara; Minoru Nakajima, Kawasaki, both of Japan

[73] Assignee: Fujitsu Limited, Kawasaki, Japan

[21] Appl. No.: 148,722

[22] Filed: May 12, 1980

[30] Foreign Application Priority Data

May 12, 1979 [JP] Japan .................................. 54-57611
Dec. 26, 1979 [JP] Japan ................................. 54-168113
Dec. 26, 1979 [JP] Japan ................................. 54-168124
Dec. 27, 1979 [JP] Japan ................................. 54-169156

[51] Int. Cl.³ ............................................ G03C 5/00
[52] U.S. Cl. ................................. 427/96; 29/577 R;
156/659.1; 430/314; 430/317; 430/318;
430/319; 430/272; 430/281; 430/283; 430/312;
427/264; 427/265
[58] Field of Search ............... 430/312, 314, 317, 318,
430/319; 156/659.1; 29/577

[56] References Cited

U.S. PATENT DOCUMENTS

| 4,023,999 | 5/1977 | Lindberg et al. | 430/317 |
| 4,092,442 | 5/1978 | Agnihotri et al. | 430/318 |
| 4,218,283 | 8/1980 | Saiki et al. | 430/318 |

FOREIGN PATENT DOCUMENTS 51-33587 9/1976 Japan .
51-44871 12/1976 Japan .
52-135713 11/1977 Japan .

*Primary Examiner*—Jack P. Brammer
*Attorney, Agent, or Firm*—Staas & Halsey

[57] ABSTRACT

Electronic devices having a multilayer wiring structure, such as a semiconductor device, a bubble memory device and a thin film magnetic head, are manufactured by using, as an insulation layer-forming material, a thermosetting addition polymerization type polyimide, i.e., a polyimide possessing imide rings in the recurring unit thereof and the degree of polymerization of which increases, when cured, due to the radical reaction of the end group or groups. The polyimide insulation layer exhibits better levelling property than that of a conventional condensational type polyimide.

28 Claims, 8 Drawing Figures

METHOD OF MANUFACTURING ELECTRONIC DEVICE HAVING MULTILAYER WIRING STRUCTURE

BACKGROUND OF THE INVENTION

1. Field of the Invention

This invention relates to an improved method of manufacturing an electronic device having a multilayer wiring structure wherein the insulation layer or layers formed therein are comprised of a polyimide.

2. Description of the Prior Art

A thermosetting polyimide resin has been heretofore widely used as an insulation layer-forming material for electronic devices having a multilayer wiring structure, such as semiconductor devices, bubble memory devices and thin-film magnetic heads. The application of a thermosetting polyimide resin is described in, for example, Japanese Patent Publication No. 44,871/1976 and Japanese Laid-open Patent Application No. 135,713/1977. The heretofore used polyimide resin is of the type which is cured through a condensation reaction represented, for example, by the following reaction formula:

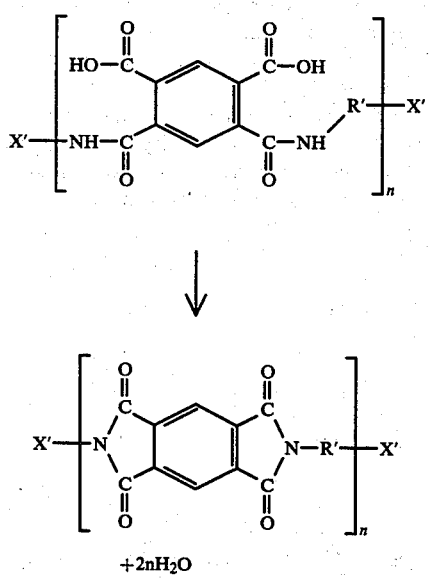

wherein R' is a divalent aromatic radical having no active hydrogen, X' is, for example,

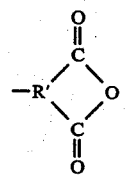

and n is a positive integer.

Namely, a polyamic acid represented by the formula (I), or its functional derivative, is condensed, when heated, to be converted to a polyimide having imide rings, represented by the formula (II), while water or other low molecular weight substances are formed. Such a thermosetting polyimide resin of the type formed through the condensation of a polyamic acid or its functional derivatives, is hereinafter referred to as a "condensational type polyimide" for brevity. Although the condensational type polyimide results in an insulation layer having good thermal resistance, it causes some problems, as mentioned below, in the manufacture of the electronic devices, because of the production of water or other low molecular weight substances in the curing step.

For example, semiconductor devices having an insulation layer or layers formed from a condensational type polyimide are generally manufactured by the steps of the following sequence, as illustrated in FIG. 1A through FIG. 1E which schematically represent, in cross-section, the sequential steps of manufacturing a semiconductor device.

(i) A semiconductor substrate 1 is prepared, having built-up circuit elements therein, with predetermined portions of the elements being exposed (non-exposed portions are covered with a protective layer 2, such as silicon dioxide), and a first metal layer of wiring 3 of a predetermined pattern is formed on the circuit elements.

(ii) An uncured polyimide resin is applied by a spin coating method to form a layer 4 of a predetermined thickness, and then, the so formed resin layer 4 is pre-cured by heating, for example, at approximately 220° C. (FIG. 1A).

(iii) A photoresist 5 is applied onto the pre-cured polyimide insulation layer 4, followed by exposure to a light through a mask of a predetermined pattern and the subsequent development thereof (FIG. 1B).

(iv) The pre-cured polyimide insulation layer 4 is etched, and then, the photo resist is removed (FIG. 1C).

(v) The pre-cured polyimide insulation layer 4 is completely cured by heating it at approximately 350°.

(vi) A second metal layer 6 of wiring of a predetermined pattern is formed on the cured polyimide insulation layer 4 and the first metal layer 3 of wiring (FIG. 1D).

(vii) The surface of the polyimide insulation layer 4 is roughened by plasma etching.

(viii) An uncured polyimide resin is applied by a spin coating method to form a layer 7 of a predetermined thickness, and then, the so formed resin layer 7 is pre-cured (FIG. 1E).

(ix) Where it is desired to manufacture a multilayer construction having three or more layers, the above-mentioned steps (iii) through (vii) are repeated.

(x) Finally, openings for providing electrical continuity to the electrodes are opened in the uppermost pre-cured polyimide layer 7, and then, the whole device is aged at a temperature of approximately 350° C. for approximately 30 minutes.

The single or each polyimide interlayer insulation layer 4 must be completely cured, as stated in the above-mentioned step (v), prior to the subsequent formation of the metal wiring layer 6 thereon. If the metal wiring layer 6 is formed on a polyimide interlayer insulation layer 4 which has been pre-cured, but not yet completely cured, the single or each polyimide interlayer insulation layer 4 undergoes curing during the above-mentioned step (x) of aging, whereby the water or other low molecular weight substances are produced, and thus, the metal wiring layer 6 is caused to bulge. Furthermore, the completely cured polyimide insulation layer 4 exhibits a poor adhesion to the polyimide insulation layer 7 formed on the insulation layer 4.

In bubble memory devices having a multilayer wiring structure, wherein the interlayer insulation layer is comprised of a thermoset condensational type polyimide, the interlayer insulation layer, or a permalloy layer of a predetermined pattern formed on the interlayer insulation layer, is caused to bulge and corrode due to the water and other low molecular weight substances produced when the polyimide interlayer insulation layer is cured. Furthermore, the thermosetting condensational polyimide exhibits leveling on a bubble memory crystal substrate on which the insulation layer of the polyimide is formed, but the leveling is not satisfactory.

In thin film magnetic heads having a multilayer wiring structure, wherein the insulation layers are comprised of a thermosetting condensational type polyimide, the polyimide insulation layers are caused to bulge when the polyimide insulation layers are cured.

SUMMARY OF THE INVENTION

It is, therefore, a main object of the present invention to provide an improved method of manufacturing an electronic device having a multilayer wiring structure wherein the insulation layer or layers involved therein are made of a thermosetting polyimide which does not produce, when cured, water nor other low molecular weight substances, and thus, the polyimide insulation layer or layers are not caused to bulge.

Another object of the present invention is to provide an improved method of manufacturing an electronic device having a multilayer wiring structure, wherein the polyimide insulation layer or layers exhibit enhanced leveling on a patterned surface and satisfactory adhesion to the adjacent layers. Still another object of the present invention is to provide an improved method of manufacturing an electronic device having a multilayer wiring structure, which method is simpler than that employed for the manufacture of a conventional electronic device possessing a thermosetting condensational type polyimide insulation layer or layers. For example, according to the method of the present invention, a semiconductor device can be manufactured, not by the above-mentioned entire steps (i) through (x), but by the steps (i) through (iv), (vi) and (viii) through (x).

In accordance with the present invention, there is provided a method of manufacturing an electronic device having a multilayer wiring structure, which comprises the steps of forming an interlayer insulation layer comprised of a thermosetting addition polymerization type polyimide on a substrate having formed thereon a first metal layer of wiring and, then, forming a second metal layer of wiring on the thermosetting addition polymerization type polyimide interlayer insulation layer.

By the term "addition polymerization type" used herein is meant that the thermosetting polyimide possesses imide rings in the molecule and its degree of polymerization increases, when cured, due to the radical reaction of the end group or groups.

DESCRIPTION OF THE PREFERRED EMBODIMENTS

The thermosetting addition polymerization type polyimide used as an interlayer insulation layer-forming material in the method of the present invention preferably includes those which are represented by the formula:

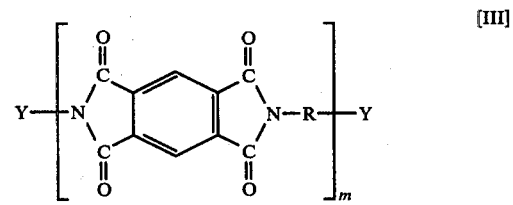

[III]

wherein the tetravalent benzene ring between the four carbonyl groups in the m-recurring unit is a particular species of a tetravalent aromatic group (containing the benzene ring) for the addition-type polyimide of the present invention, wherein R is a divalent aromatic or aliphatic radical having no active hydrogen, each end group Y comprises a reactive triple bond group, for example, the ethynyl or carbonitril groups,

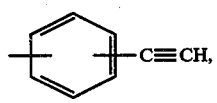

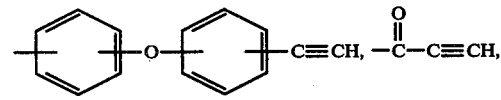

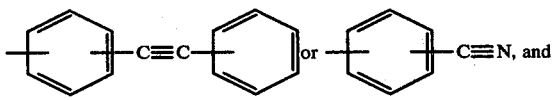

m is a positive integer. The divalent radical R includes, for example,

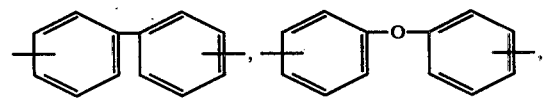

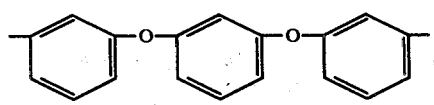

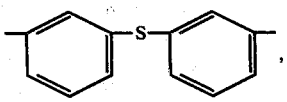

-continued

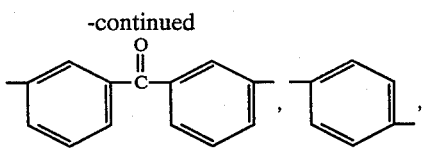

—CH$_2$— and —CH$_2$.CH$_2$—. Of these,

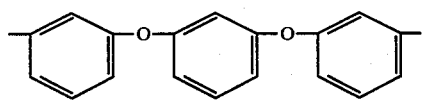

is most preferable because the polyimide having this radical provides a coating film having good flexibility. Among the end groups Y, mentioned above, preferable are

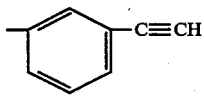

and

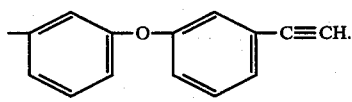

Figure 4:
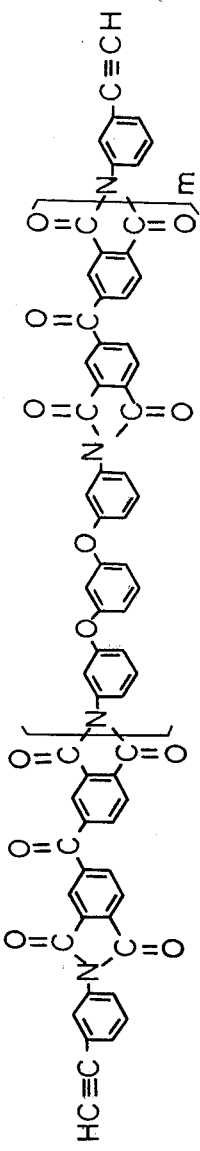

The most preferable addition polymerization type polyimide is THERMID 600 (trade name, supplied by Gulf Oil Chemicals Co.), represented by the formula shown in FIG. 4.

Preferable thermosetting addition polymerization type polyimides used possess a molecular weight range of from approximately 800 to approximately 20,000 more preferably from approximately 1,000 to approximately 10,000, and are capable of being dissolved in ketones, such as methyl ethyl ketone, acetophenone and isophorone. When the polyimides used possess a salient amount of a portion having molecular weights of lower than approximately 800, the polyimides exhibit poor film-forming property and the resulting coatings are liable to develop surface defects such as fine wrinkles. In contrast, when the polyimides possess a salient amount of a portion having molecular weights of higher than approximately 20,000, the resulting coatings exhibit a poor thermal resistance and a poor leveling capability.

The thermosetting addition polymerization type polyimides, which are soluble in ketones, exhibit satisfactory film-forming properties and result in a uniform coating film. In contrast, the thermosetting addition polymerization type polyimides, which are insoluble in ketones, are liable to run-away when their solutions are coated on a metal surface, in other words, they are liable to not wet a metal surface. Thus, such insoluble polyimides do not result in a uniform coating film.

The thermosetting addition polymerization type polyimides can be applied onto a substrate having formed thereon a metal wiring layer in the form of a coating solution. Solvents used for the preparation of the coating solution include, for example, N-methyl-2-pyrrolidone, dimethylacetamide and ketones such as acetophenone and isophorone. Although the suitable concentration of polyimide in the coating solution varies depending upon the molecular weight of polyimide, the solvent and the electronic device, the concentration of polyimide may be not more than 55% by weight. The coating may be conducted by spin coating and other conventional coating techniques.

A coating film of polyimide formed on the substrate having formed therein a metal wiring layer may be cured in a conventional manner, for example, at a temperature of approximately 250° C. and, then, at a temperature of 350° C.

Typical methods of manufacturing electronic devices having a multilayer wiring structure wherein the insulation layer or layers are made of a thermoset additional polymerization type polyimide will now be illustrated with reference to the accompanying drawings.

Referring to FIGS. 1A through 1E, a semiconductor device is manufactured by the following sequential steps.

(i) A semiconductor substrate 1 is prepared, having built-up circuit elements therein, with predetermined portions of the elements being exposed (non-exposed portions are covered with a protective layer 2, such as silicon dioxide) and a first metal layer of wiring 3 of a predetermined pattern is formed on the circuit elements.

Figure 1A:
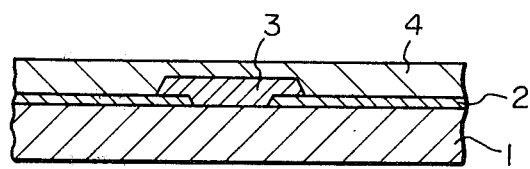
FIGS. 1A through 1E schematically illustrate, in cross-section, the sequential steps of manufacturing a semiconductor device.

(ii) An uncured polyimide resin is applied by spin coating to form a polyimide layer 4 and, then, the so formed resin layer 4 is pre-cured by heating, for example, at approximately 250° C. (FIG. 1A).

Figure 1B:
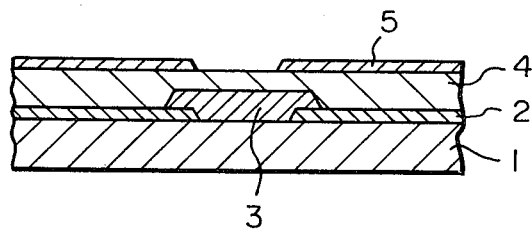

(iii) A photoresist 5 is applied onto the pre-cured polyimide insulation layer 4, followed by exposure to a light through a mask of a predetermined pattern and the subsequent development thereof (FIG. 1B).

Figure 1C:
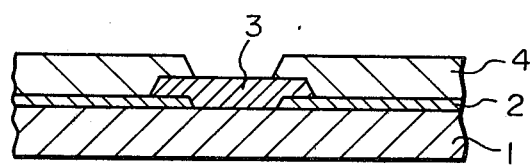

(iv) The pre-cured polyimide insulation layer 4 is etched and, then, the photoresist is removed (FIG. 1C).

Figure 1D:
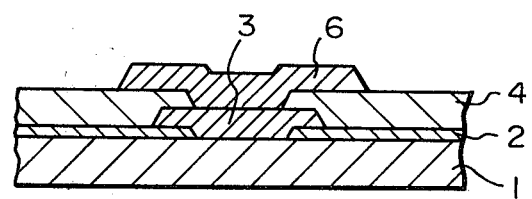

(v) A second metal layer 6 of wiring of a predetermined pattern is formed on the cured polyimide insulation layer 4 and the first metal layer 3 of wiring (FIG. 1D).

Figure 1E:
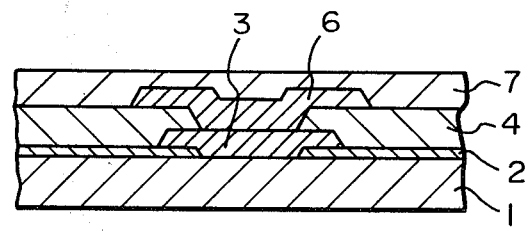

(vi) An uncured polyimide resin is applied by spin coating to form a polyimide layer 7 and, then, the so formed resin layer 7 is pre-cured (FIG. 1E).

(vii) Where it is desired to manufacture a multilayer construction having three or more layers, the above-mentioned steps (iii) through (vi) are repeated.

(viii) Finally, openings for providing electrical continuity to the electrode are opened in the uppermost pre-cured polyimide layer 7 and, then, the whole device is aged, for example, at approximately 350° C.

Figure 2:
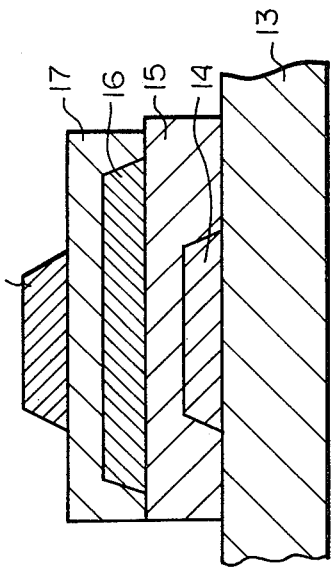
FIG. 2 illustrates in cross-section a portion of a bubble memory device manufactured according to a preferred embodiment of the present invention.

Referring to FIG. 2, a bubble memory device is manufactured as follows.

(i) A metal conductor pattern 2 is formed on a bubble memory crystalline substrate 8 (if desired, an insulation layer comprised of, e.g., SiO$_2$, is formed prior to the formation of the metal conductor pattern 2).

(ii) An uncured polyimide resin is applied by spin coating to form a polyimide insulation layer 10 and, then, the so formed insulation layer is cured, for example, at 350° C.

(iii) An Al$_2$O$_3$ layer of 300 angstroms in thickness is formed by sputtering or an aluminum layer of 500 angstroms is formed by vapor deposition, and then, a titanium or tantalum layer of 300 to 500 angstroms in thickness is formed by vapor deposition.

(iv) A permalloy layer 11 of a predetermined pattern is formed.

(v) If desired, an uncured polyimide is applied by spin coating to form a protective layer 12 and, then, the so formed layer is cured.

Figure 3:
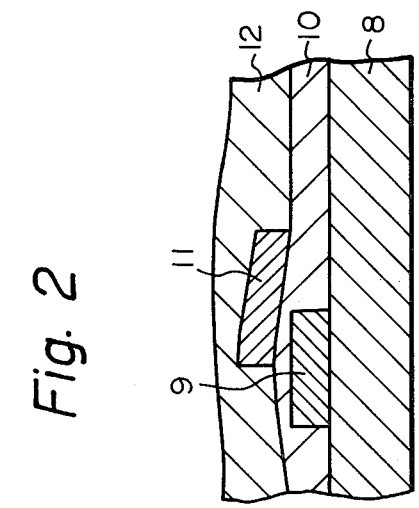
FIG. 3 illustrates in cross-section a portion of a thin film magnetic head manufactured according to a preferred embodiment of the present invention; and, FIG. 4 illustrates a chemical formula of one example of an addition polymerization type polyimide used in the method of the present invention.

Referring to FIG. 3, a single turn type thin film magnetic head is manufactured as follows.

(i) A lower magnetic layer 14 comprised of permalloy having a predetermined pattern is formed on a substrate 13.

(ii) An uncured polyimide is applied by spin coating and, then, the so formed coating layer is cured, followed by patterning by using hydrazine or oxygen plasma to form an insulation layer 15.

(iii) A metal conductor layer 16 in coil form is formed.

(iv) A polyimide insulation layer 17 is formed in a manner similar to that mentioned in (ii) above.

(v) An upper magnetic layer 18 of a predetermined pattern is formed.

A multi-turn type thin film magnetic head may be manufactured in a similar manner.

The invention will be further illustrated by the following examples.

In the examples, the molecular weight of polyimide was determined according to gas permeation chromatography by using a calibration curve of polystyrene.

Surface roughness was expressed in terms of average maximum height "R-max," rated in microns, of the contour of a section perpendicular to a surface (which contour is referred to as "profile"). The average maximum height "R-max" was determined according to Japanese Industrial Standard B0601 (1970) as follows. A reference line in parallel to the general direction of the profile was drawn throughout a given reference length so that the sum of the squares of deviations from the reference line became minimum. The reference length was 0.25 mm when the R-max was up to 0.8 micron and was 0.8 mm when the R-max exceeded 0.8 micron up to 6.3 microns. Two lines parallel to the reference line were drawn, which passed the highest peak and the deepest valley, respectively, of the profile for the reference length. The distance between the two lines as measured along a line perpendicular to the surface was defined as the maximum height for the reference length.

EXAMPLE 1

This example illustrates that the surface defects, expressed in terms of surface roughness, of polyimide coating film vary depending upon the molecular weight distribution of polyimide.

100 g of an addition polymerization type polyimide having a weight average molecular weight $\overline{M}$ of $1.9 \times 10^3$ and a number average molecular weight $\overline{M}n$ of $9.4 \times 10^2$ ($\overline{M}w/\overline{M}n = 2.0$) (trade name "THERMID 600," supplied by Gulf Oil Chemicals Co.) were dissolved under agitation in a mixed solvent consisting of 100 g of N-methyl-2-pyrrolidone, 400 g of methyl ethyl ketone and 400 g of methanol. The insoluble matter of the polyimide was filtered off (which matter is hereinafter referred to as "fraction I"), and the filtrate was dropwise added to 604 g of N-hexane while being stirred. The insoluble matter was removed from the N-hexane solution (which matter is hereinafter referred to as "fraction III"). The insoluble residue was dissolved in 100 g of acetone, and the insoluble matter was filtered off from the acetone solution. The filtrate was poured into 400 g of N-hexane to form a precipitate. The precipitate was dried under reduced pressure to obtain a purified polyimide (which is hereinafter referred to as "fraction II").

The average molecular weights and yields of the respective fractions were as follows.

| Fraction | $\overline{M}w$ | $\overline{M}n$ | $\overline{M}w/\overline{M}n$ | Yield (wt. %) |
|---|---|---|---|---|
| Original polyimide | $1.9 \times 10^3$ | $9.4 \times 10^2$ | 2.0 | — |
| Fraction I | $1.6 \times 10^3$ | $7.4 \times 10^2$ | 2.1 | 10 |
| Fraction II | $3.5 \times 10^3$ | $2.5 \times 10^3$ | 1.4 | 12 |
| Fraction III | $1.1 \times 10^3$ | $7.2 \times 10^2$ | 1.5 | 63 |

The fraction II only contained negligible amounts of a component having a molecular weight of smaller than 1,000 and a component having a molecular weight of larger than 1,000.

Each of the original polyimide and the fractions I, II and III was dissolved in a solvent to prepare a coating solution. The solvent used and the concentration of the solution are shown in Table I, below. The solution was spin-coated on a silicon wafer by using a spin coater. The coating film was cured at 100° C. for one hour, at 220° C. for one hour and, then, at 350° C. for one hour. The thickness and surface roughness of the cured coating film are shown in Table I, below.

TABLE I

| Polyimide specimen | Solvent *1 | concentration (wt. %) | Average film thickness (microns) | Surface roughness R-max (microns) | Reference length (mm) |
|---|---|---|---|---|---|
| Original polyimide | NMP | 50% | 2.0 | 2.1 | 0.8 |
| Fraction III | DMAC | 40% | 2.5 | 2.0 | 0.8 |
| Fraction I | DMAC | 5% | 0.2 | 1.5 | 0.8 |
| Fraction II | DMAC | 40% | 2.0 | Below 0.001 | 0.25 |

*1 NMP = N-methyl-2-pyrrolidone
DMAC = Dimethylacetamide

As is seen from Table I, a polyimide having a molecular weight range of from approximately 1,000 to approximately 10,000 (Fraction II) exhibits excellent surface smoothness and, thus, no surface defects.

EXAMPLE 2

This example illustrates that the levelling of polyimide on a rough surface is dependent upon the particular type of polyimide.

A polyimide having an $\overline{M}w$ of $2.0 \times 10^3$ and an $\overline{M}w/\overline{M}n$ ratio of 1.8 was dissolved in a mixed solvent of N-methyl-2-pyrrolidone/dimethylacetamide/toluene (=10/9/1 by weight) at a concentration of 45% by weight to prepare a coating solution. The solution was spin-coated, by using a spin coater, on a silicon wafer having formed thereon an aluminum wiring pattern 0.9 micron in height and 5 microns in width. The coating film was cured at 250° C. for one hour and, then, at 350° C. for one hour. The cured coating film had a thickness of 2 microns and exhibited a film surface undulation of 0.07 micron on the line-and-space patterns.

For comparison purposes, a cured coating film was formed from a condensational type polyimide (trade name "PIQ," supplied by Hitachi Kasei K.K.). That is, the polyimide was dissolved in a mixed solvent of N-methyl-2-pyrrolidone/dimethylacetamide (=1/1 by weight) at a concentration 14% by weight to prepare a coating solution. The solution was spin-coated in a manner similar to that mentioned above. The coating film was cured at 220° C. for one hour, and, then, at 350° C. for one hour. The cured coating film had a thickness of 2 microns and exhibited a film surface undulation of 0.66 micron on the line-and-space patterns.

As is seen from the above-mentioned results, an additional polymerization type polyimide exhibits a far enhanced levelling on a rough surface as compared with a condensational polymerization type polyimide.

In general, when a condensational type polyimide is cured, its condensation occurs at approximately 100° C. or higher and the polyimide rapidly loses its fluidity, which leads to reduction in the levelling on a rough surface. In contrast, an addition polymerization type polyimide is cured at a far higher temperature (the polyimide used in Example 2 has a melting point of 190° C. as measured by differential thermal analysis), and therefore, it is presumed that the polyimide exhibits excellent levelling on a rough surface.

EXAMPLE 3

This example illustrates the application of polyimide for the insulation layers of a semiconductor device.

A semiconductor substrate 1 consisting of a silicon substrate having formed therein circuit elements was prepared, with predetermined portions of the elements being exposed and the non-exposed portions being covered with a silicon dioxide protective layer 2 approximately 0.3 micron in thickness. A first aluminum wiring layer 3 of a predetermined pattern was formed on the circuit elements to a thickness of approximately one micron in a conventional manner. An additional polymerization type polyimide (the same as fraction II mentioned in Example 1) was dissolved in a mixed solvent of N-methyl-2-pyrrolidone/dimethylformamide/toluene (=84/27/3 by weight) at a concentration of 42% by weight. The coating solution, so obtained, was applied onto the first aluminum wiring layer by a spin-coating technique in a nitrogen atmosphere. The spin-coating was carried out at 1,000 rpm for 10 seconds and, then, at 3,000 for 50 seconds. The polyimide coating 4 was heated at 120° C. for 30 minutes and, then, at 250° C. for 30 minutes in a nitrogen atmosphere, to be thereby precured (FIG. 1A).

A negative resist 5 was applied onto the pre-cured polyimide coating layer 4, exposed to light via a mask of a predetermined pattern and, then, developed, whereby parts of the resist were removed to form openings which were each 3 microns square (FIG. 1B). Thereafter, the underlying polyimide layer 4 was etched at 40° C. with a mixed solution of hydrazine, ethylenediamine and water, and then, the resist 5 was removed (FIG. 1C). Thus, the formation of the first polyimide layer 4 having openings was completed.

Similarly, a second aluminum wiring layer, a second polyimide layer, a third aluminum wiring layer and a third polyamide layer were successively formed on the first polyimide layer. Openings extending through the uppermost third polyimide layer to the third aluminum wiring layer were formed and, then, the entire assembly was aged at a temperature of 350° C., for 30 minutes, in a nitrogen atmosphere, thereby to obtain a semiconductor device having a three layer wiring structure.

In the above-mentioned course of manufacturing the semiconductor device, the respective polyimide layers were not completely cured in each step of the formation thereof, and it was not attempted, either, to roughen the surface of the existing polyimide layer prior to forming the next polyimide layer. However, no bulging of the aluminum wiring layers was observed and the adhesion between the adjacent polyimide layers was satisfactory.

EXAMPLE 4

This example illustrates the application of polyimide for the insulation layer of a bubble memory device.

An addition polymerization type polyimide (the same as fraction II mentioned in Example 1) was dissolved in dimethylacetamide to obtain a coating solution having a polymer concentration of 40% by weight. The coating solution was spin-coated by using a spin coater on a bubble memory crystalline substrate having an aluminum conductor pattern 0.4 micron in height and 4 microns in width. The coating layer was cured at 250° C. for one hour and, then, at 350° C. for one hour. The cured coating layer had a thickness of 0.4 micron and exhibited an undulation of 0.03 micron on the aluminum conductor patterns and spaces.

For comparison purposes, a cured polyimide coating layer was formed from a condensational type polyimide similar to that used in Example 2 on a bubble memory crystal substrate having an aluminum conductor pattern, in a manner similar to that mentioned above. The cured polyimide coating layer, so formed, exhibited an undulation of 0.26 micron.

On each of the above-mentioned cured polyimide coating layers an aluminum layer 300 angstroms in thickness was formed by vapor deposition, and a titanium layer 300 angstroms in thickness was further formed on the aluminum layer by vapor deposition. Thereafter, a permalloy layer 4,500 angstroms in thickness was formed by a conventional vapor deposition procedure and, then, the permalloy was etched by ion milling, thereby to form a pattern. Measurement of propagation characteristics in the major portion of the bubble memory device indicated that the driving magnetic field of the device obtained from the addition polymerization type polyimide was smaller by 5 to 20 oersteds than that of the device obtained from the condensational type polyimide.

EXAMPLE 5

This example illustrates the levelling and adhesion of polyimide when the polyimide is used for an insulation layer of a thin film magnetic head.

An addition polymerization type polyimide (the same as fraction II mentioned in Example 1) was dissolved in dimethylacetamide to obtain a coating solution having a polymer concentration of 35% by weight. The coating solution was spin-coated, by using a spin coater, on a substrate having repetitively formed aluminum patterns thereon. The polyimide coating layer was cured in a manner similar to that mentioned in Example 1 to form an insulation layer one micron in thickness. The insulation layer exhibited an undulation of 0.10 micron on the patterns and spaces.

For comparison purposes, a polyimide insulation layer was formed from a condensational type polyimide similar to that used in Example 2, in a manner similar to that mentioned above. The insulation layer exhibited an undulation of 0.67 micron on the patterns and spaces.

The above-mentioned procedure for the formation of the addition polymerization type polyimide insulation layer was repeated, wherein a layer of $Al_2O_3$, $TiO_2$ or $CrO_2$ was formed on the substrate to a thickness of 200 angstroms, by sputtering, prior to the application of the polyimide coating solution. The adhesion between the polyimide insulation layer and the intermediate metal oxide layer was tested on the resultant coated substrate as follows. 100 squares, each having sides 1 mm in length, were cut by drawing on the polyimide insulation layer eleven lines spaced 1 mm apart and, further, eleven lines spaced the same distance apart but perpendicular to the former lines by using a razor blade. The substrate was immersed in boiling water for one hour. A pressure-sensitive adhesive tape was stuck onto the cut insulation layer and, then, the tape was peeled off. The adhesion was expressed by the number of the squares remaining on the substrate. The test results are shown in Table II, below.

TABLE II

| Intermediate metal oxide layer | Permalloy substrate | SiO$_2$ substrate |
|---|---|---|
| — | 73 | 5 |
| Al$_2$O$_3$ | 100 | 99 |
| TiO$_2$ | 98 | 97 |
| Cr$_2$O$_3$ | 98 | 98 |

As is seen from Table II, the intermediate metal oxide layer enhances the adhesion of the polyimide insulation layer to the substrate.

EXAMPLE 6

An Al$_2$O$_3$ layer 200 angstroms in thickness was formed on an SiO$_2$ substrate by sputtering. An addition polymerization type polyimide solution, similar to that prepared in Example 4, was spin-coated on the Al$_2$O$_3$ layer of the substrate and, then, cured, in a manner similar to that mentioned in Example 1. No run-away of the solution was observed in the coating step and the coating film exhibited a levelling capability similar to that attained in Example 1.

The above-mentioned procedure was repeated, wherein SiO$_2$ substrate surface-treated with aminosilane was used in place of the Al$_2$O$_3$ sputtered SiO$_2$ substrate, with all other conditions remaining substantially the same. No run-away of the solution was observed in the coating step and the coating film exhibited a levelling capability similar to that attained in Example 1.

We claim:

1. In a method of manufacturing on a substrate an electronic device including a multilayer wiring structure comprising forming an interlayer insulation layer comprised of a thermosetting polyimide between a previously formed respective lower metal layer of wiring and a subsequently formed respective upper metal layer of wiring, said method comprising forming said multilayer wiring structure to have at least one of said interlayer insulation layers between at least one pair of said respective upper and lower metal wiring layers, the improvement comprising using as the thermoset polyimide an addition polymerization type polyimide comprising imide rings in the recurring groups and reactive end groups with triple bonds.

2. The method of claim 1, wherein each said recurring group comprising a tetravalent aromatic group between two of said imide rings.

3. The method of claim 2, wherein said addition polymerization type polyimide being represented by the formula:

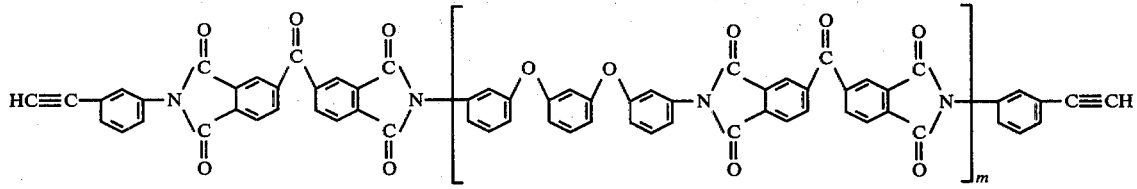

4. The method of claim 1, wherein each said reactive end group with a triple bond comprising a group that is the ethynyl or carbonitril group.

5. The method of claim 2, wherein said addition polymerization type polyimide is represented by the formula:

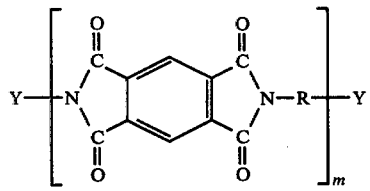

wherein R is a divalent aromatic or aliphatic radical having no active hydrogen, and m is a positive integer, each Y group comprising one of said end groups with a triple bond.

6. The method of claim 4, wherein each of said reactive end groups with a triple bond comprises

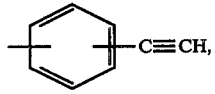

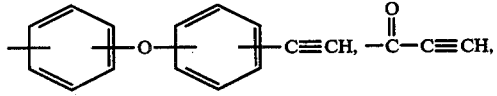

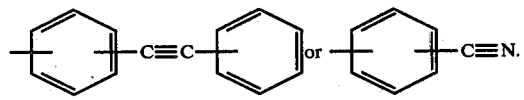

7. The method of claim 1, 2, 3, 5, or 6 wherein each said addition polymerization type polyimide has a molecular weight range of from approximately 800 to approximately 20,000.

8. The method of claim 1, 2, 3, 5 or 6 wherein said addition polymerization type polyimide of at least one of said at least one interlayer insulating layer(s) is soluble in acetone.

9. The method of claim 1, 2, 3, 5 or 6, wherein the formation of each polyimide interlayer insulation layer is carried out by coating the substrate having formed thereon said respective lower metal layer of wiring with a coating solution of the polyimide in a solvent selected from the group consisting of N-methyl-2-pyrrolidone, dimethylacetamide and ketones, the polyimide concentration in the coating solution being not more than 55% by weight.

10. The method of claim 1, 2, 3, 5 or 6, the electronic device comprising built up circuit elements that are selectively covered with a protective layer to define exposed and nonexposed portions of said circuit elements of said device, the forming of said multilayer wiring structure comprising the steps of:
(A) forming a first metal layer of said multilayer wiring structure to have a predetermined pattern on said semiconductor substrate having said build-up circuit elements with said exposed and non-exposed portions;
(B) subsequently performing at least one sequence of the following steps (i) to (iii):
(i) applying the addition polymerization type polyimide to form a polyimide layer over said substrate with said circuit elements and on the uppermost wiring layer previously formed thereon as the respective lower wiring layer, followed by pre-curing of the polyimide layer;
(ii) imparting a predetermined pattern to the pre-cured polyimide layer, to selectively form openings in at least the uppermost polyimide layer to selectively expose the underlying wiring including said respective lower wiring layer; and
(iii) selectively forming the respective upper metal layer of wiring on predetermined portions of the polyimide layer and said openings therein,
said forming of said multilayer wiring structure subsequently comprising:
(C) applying the addition polymerization type polyimide to form a final polyimide layer, followed by precuring the final polyimide layer;
(D) selectively providing openings for electrical contact to the metal wirings under the final polyimide insulation layer, and
(E) simultaneously completing the curing of all of said polyimide layers.

11. The method of claim 1, 2, 3, 5 or 6, the electronic device comprising a bubble memory device, said substrate comprising a bubble memory crystalline substrate, said method comprising the steps of:
forming a metal conductor pattern on said substrate as the first respective lower metal layer of wiring
forming the first interlayer insulation layer with a predetermined pattern; and
forming a permalloy layer of a predetermined pattern on said polyimide layer as the first respective upper metal layer of wiring.

12. The method of claim 1, 2, 3, 5 or 6, wherein the electronic device having the multilayer wiring structure is a thin film magnetic head and said method comprises the steps of:
(i) forming on the substrate a lower metal wiring layer of a magnetic layer having a predetermined pattern;
(ii) applying the addition polymerization type polyimide to form a polyimide layer, followed by curing the polyimide layer and, further, by patterning the cured polyimide layer to form an interlayer insulation layer;
(iii) forming an upper metal wiring layer in a coil form on said interlayer insulation layer;
(iv) forming a second insulation layer in the manner of step (ii) above on said substrate with said lower magnetic layer, said first insulation layer and said metal conductor layer; and then
(v) forming an upper magnetic layer with a predetermined pattern on said second insulating layer.

13. The method of claim 12, wherein a layer comprised of $Al_2O_3$, $TiO_2$ and $Cr_2O_3$ is formed between the steps of (i) and (ii).

14. The method of claim 12, wherein a layer comprised of at least one metal oxide selected from the group consisting of $Al_2O_3$, $TiO_2$ and $Cr_2O_3$ is formed between the steps of (iv) and (v).

15. The method of claim 12, wherein two layers, each comprised of at least one metal oxide selected from the group consisting of $Al_2O_3$, $TiO_2$ and $Cr_2O_3$ are formed, one being between the steps of (i) and (ii), and the other between the steps of (iv) and (v).

16. The method of claim 5, wherein R is

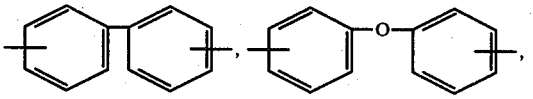

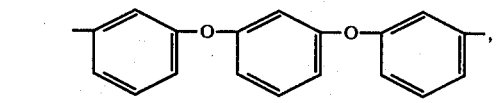

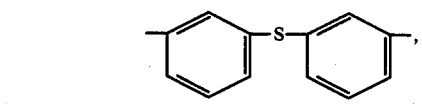

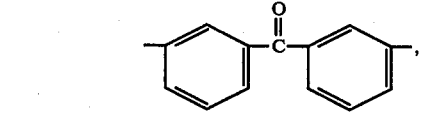

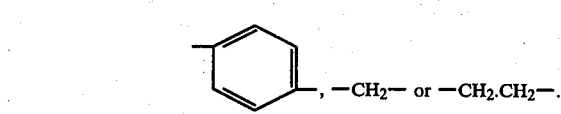, $-CH_2-$ or $-CH_2.CH_2-$.

17. The method of claim 7, said molecular weight range being from approximately 1,000 to approximately 10,000.

18. The method of claim 1, 2, 3, 5 or 6, said device comprising at least two of said interlayer insulation layers, said method comprising first precuring individually each said interlayer insulation layer and subsequently simultaneously completing the curing of all of said interlayer insulation layers.

19. The method of claim 1, 2, 3, 5 or 6, comprising forming at least one interlayer insulating layer directly on the surface of said substrate with said first metal layer of wiring.

20. The method of claim 1, 2, 3, 5 or 6, said device comprising at least two of said interlayer insulation layers, the surface of the first interlayer insulation layer in contact with the second insulation layer being the original surface of the first interlayer insulation layer as formed.

21. The method of claim 10 comprising
precuring each said layer of addition polyimide at a temperature of up to approximately 250° C., and simultaneously completing the curing of all said layers of the addition polyimide at a temperature of up to approximately 350° C.

22. The method of claim 18, comprising
precuring each said interlayer insulating layer at a temperature of up to approximately 250° C.; and
simultaneously completing the curing of all said layers at a temperature of up to approximately 350° C.

23. The method of claim 11, comprising
selectively forming an insulation layer on said metal conductor pattern prior to forming said first interlayer insulation layer.

24. The method of claim 11, comprising
completely curing said first interlayer insulation layer prior to forming said permalloy layer.

25. The method of claim 9, said solvent comprising dimethyl acetamide, said method comprising forming at least one of said interlayer insulating layers with a surface roughness R-max value of less than 0.001 microns.

26. The method of claim 1, 2 or 3 comprising
forming a layer of amino silane on said substrate and the first metal layer of wiring prior to forming the first interlayer insulating layer.

27. The method of claim 1, 2 or 3 comprising
forming a respective lower layer of metal wiring of aluminum of up to 0.9 microns thickness, and
forming the first interlayer insulating layer to have an undulation over the edge of said first wiring layer of less than approximately 0.1 microns.

28. The method of claim 2 or 5, each said reactive end group with a triple bond comprising a group that is the ethynyl or carbonyl group.

* * * * *

UNITED STATES PATENT AND TRADEMARK OFFICE
CERTIFICATE OF CORRECTION

PATENT NO. : 4,347,306

DATED : 31 August 1982

INVENTOR(S) : SHIRO TAKEDA et al

It is certified that error appears in the above-identified patent and that said Letters Patent is hereby corrected as shown below:

Front page, [57] ABSTRACT, line 10, after "exhibits" insert --a--.

Col. 6, line 47, "electrode are" should be --electrodes are--.

Col. 11, line 49, after "wherein" insert --an--.

Col. 13, line 14, "build-" should be --built--.

Signed and Sealed this

Eighteenth Day of January 1983

[SEAL]

Attest:

GERALD J. MOSSINGHOFF

Attesting Officer   Commissioner of Patents and Trademarks